United States Patent
Pham et al.

(10) Patent No.: US 8,268,668 B1
(45) Date of Patent: Sep. 18, 2012

(54) DESTRUCTOR INTEGRATED CIRCUIT CHIP, INTERPOSER ELECTRONIC DEVICE AND METHODS

(75) Inventors: Cuong V. Pham, San Diego, CA (US); David E. Chubin, Northridge, CA (US); Aaron D. Kuan, Huntington Beach, CA (US); Colleen L. Khalifa, Perris, CA (US)

(73) Assignee: Teledyne Technologies Incorporated, Thousand Oaks, CA (US)

( * ) Notice: Subject to any disclaimer, the term of this patent is extended or adjusted under 35 U.S.C. 154(b) by 230 days.

(21) Appl. No.: 12/798,733

(22) Filed: Apr. 9, 2010

Related U.S. Application Data

(63) Continuation-in-part of application No. 11/043,626, filed on Jan. 25, 2005, now Pat. No. 7,705,439.

(51) Int. Cl.
*H01L 23/02* (2006.01)

(52) U.S. Cl. ........ 438/106; 438/121; 257/678; 257/922; 257/E23.002

(58) Field of Classification Search ............ 257/678; 438/106
See application file for complete search history.

(56) References Cited

U.S. PATENT DOCUMENTS
2003/0230801 A1 * 12/2003 Jiang et al. ............ 257/723

FOREIGN PATENT DOCUMENTS
DE           10252329 A1 * 5/2004
* cited by examiner

*Primary Examiner* — Ajay K Arora
(74) *Attorney, Agent, or Firm* — K&L Gates LLP

(57) ABSTRACT

A method of fabricating an electronic circuit including forming a first depression on a first surface of a first wafer and forming a second depression on the first surface of the first wafer. The second depression is adjacent the first depression and separated from the first depression by a wall. The method further includes locating an actuator on the wall and attaching a first surface of a second wafer to the first surface of the first wafer to cover the first and second depressions. A first portion of the second wafer and the first depression define a first reservoir to contain a first chemical, and a second portion of the second wafer and the second depression define a second reservoir to contain a second chemical.

19 Claims, 5 Drawing Sheets

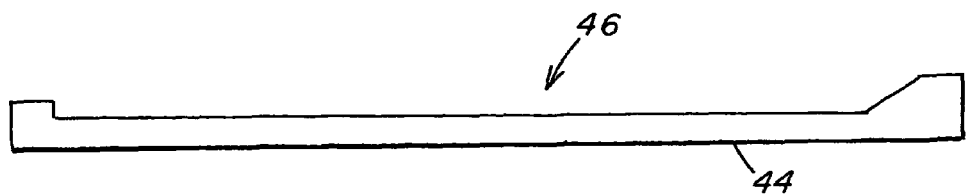
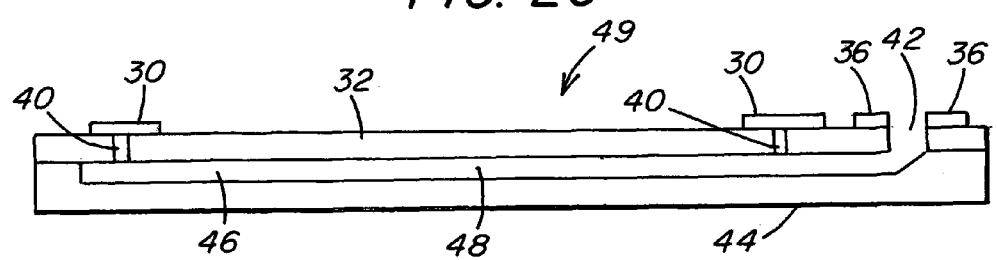
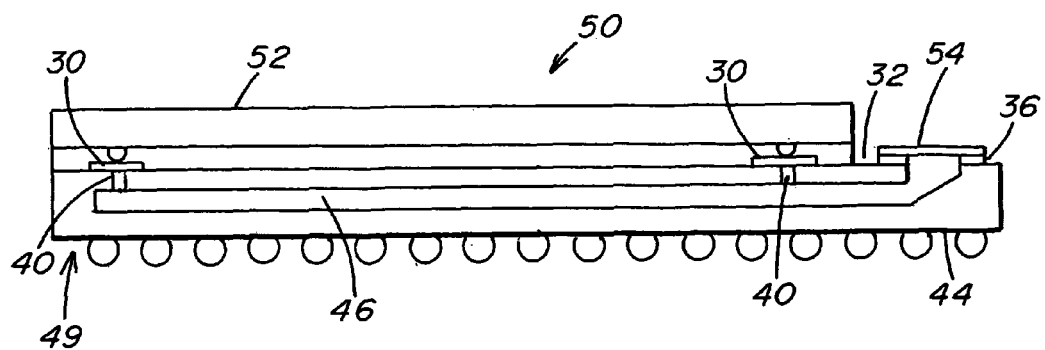

DESTRUCTOR INTEGRATED CIRCUIT CHIP, INTERPOSER ELECTRONIC DEVICE AND METHODS

REFERENCE TO PRIOR APPLICATIONS

This application is a continuation-in-part of prior U.S. application Ser. No. 11/043,626, filed Jan. 25, 2005, now U.S. Pat. No. 7,705,439, issued Apr. 27, 2010, the entirety of which is incorporated herein by reference.

BACKGROUND

Anti-tamper (AT) protection is employed so that it is very difficult to reverse engineer or alter the function of electronic hardware (e.g., computer processors, integrated circuits, multi-chip modules, etc). For some commercial applications, designers often spend vast sums of money to develop a "next generation" circuit. These companies often wish to deter, or at least hamper, a competitor's reverse engineering efforts. The motivation in this case is to protect valuable intellectual property. Military and Government users also have a strong interest in AT protection. When new military hardware is fielded, often the consequences of capture are not fully understood or considered by the designer of the hardware. Similarly, the combat loss of any one of a thousand pieces of sensitive, high-tech military hardware could do irreparable damage to national security.

AT standards have been defined according to the Federal Information Protection Standard (FIPS) 140-2. The standard describes the requirements for four levels of protection. For the standards for multi-chip, embedded modules, Level 1 calls for standard passivation techniques (i.e., a sealing coat applied over the chip circuitry to protect it against environmental or other physical damage). The standard describes that Level 2 can be achieved using anti-tamper coatings or passive AT. Level 3 may use passive AT if tampering will likely destroy the module. Level 4 requires the use of active AT technologies.

Most AT is categorized as either passive or active. In each case, the intent is to delay, prevent or stop tampering and potential reverse engineering of an electronic circuit. Passive AT is currently the most widespread method of deterring an opponent from reverse engineering or spoofing an electronic circuit. Current passive AT arrangements include encapsulation and various types of conformal coatings such as epoxies. Methods to defeat common encapsulants are well documented.

Layered anti-tamper arrangements are also employed in which alternating layers of passive AT with active AT yields a synergy in probing difficulty. With active AT methods, a protected circuit will take some action when unauthorized activities are detected. Any number of events can trigger a programmed circuit response. Examples of active triggering arrangements include: voltage, photon detection, acceleration, strain, thermal, chemical attack, and proximity or tamper-respondent enclosures. The response of an active AT circuit upon triggering is also widely variable. For example, zeroization may be employed in which critical memory cells or an entire die can be erased. Similarly, a response can trigger overwriting of some or all of a memory die. Another detection response is to physically obliterate or mutilate the circuit using, for example, embedded microexplosive charges beneath dice. In this case, when power is improperly removed or when tampering is otherwise detected, the circuit literally destroys itself.

SUMMARY

In one embodiment, the present application is directed to a semiconductor chip including an integrated circuit chip and a depression substrate attached to the integrated circuit chip, wherein the integrated circuit chip and the depression substrate define a cavity therebetween. The semiconductor chip also includes a stress sensitive material located in the cavity and a chemical located in the cavity, wherein detection of tampering causes a reaction by the chemical such that the semiconductor chip is at least partially destroyed.

In one embodiment, the cavity includes a stress-sensitive material, such as a piezoelectric, located therein. In such an embodiment, when an intrusion is detected and a signal received, the stress-sensitive material initiates a reaction by the chemical such that the package is at least partially destroyed.

In one embodiment, the cavity includes a stress-sensitive material, such as a piezoelectric, located therein. In such an embodiment, when an intrusion is detected and a signal received, the stress-sensitive material reacts such that the package is at least partially destroyed.

In one embodiment, the present application is directed to a destructor electronic device. The destructor electronic device includes an interposer defining a cavity therein and a chemical located in the cavity. The semiconductor package also includes a conductive via extending from a top surface of the interposer to the cavity, wherein an electrical signal passed through the conductive via causes a reaction by the chemical such that the destructor electronic device is at least partially destroyed.

In one embodiment, the present application is directed to a semiconductor interposer. The semiconductor interposer includes a first substrate and a second substrate, wherein the first substrate and the second substrate define a cavity therebetween. The semiconductor interposer also includes a stress-sensitive material located in the cavity, wherein receipt of a signal from a sensor causes a reaction by the stress-sensitive material such that the semiconductor interposer is at least partially destroyed.

In one embodiment, the present application is directed to a method of fabricating a destructor electronic device. The method includes attaching a first substrate to a second substrate such that a cavity is formed therebetween, wherein one of the first substrate and the second substrate includes an opening to the cavity and filling at least a portion of the cavity with a chemical.

In one embodiment, the present application is directed to a method of fabricating a destructor electronic device. The method includes forming a via in a first substrate, forming an opening in the first substrate, and filling the via with a conductive material. The method also includes forming a channel in a second substrate, bonding the first substrate to the second substrate such that the opening and the channel form a reservoir and the via extends into the reservoir, and filling at least a portion of the reservoir with a chemical.

In various embodiments, the present application is directed to methods of fabricating semiconductor and MCM packages. The packages can be fabricated from a number of materials including high temperature co-fired ceramic (HTCC), low temperature co-fired ceramic (LTCC), silicon dioxide, aluminum oxide, beryllium oxide ceramics, epoxy-glass laminate, polyimide-glass laminate, etc.

In various embodiments, the present application is directed to methods of fabricating an electronic circuit. A method according to one such embodiment includes forming a first depression on a first surface of a first wafer and forming a second depression on the first surface of the first wafer. The second depression is adjacent the first depression and separated from the first depression by a wall. The method further includes locating an actuator on the wall and attaching a first surface of a second wafer to the first surface of the first wafer to cover the first and second depressions. A first portion of the second wafer and the first depression define a first reservoir to contain a first chemical, and a second portion of the second wafer and the second depression define a second reservoir to contain a second chemical.

In various embodiments, the present application is directed to a method that includes forming an interposer structure to include a first surface to electrically interface with a first device, a second surface to electrically interface with a second device, and a cavity positioned between the first and second surfaces to receive one or more chemicals. The interposer structure is to form an electrical connection between the first device and the second device.

In various embodiments, the present application is directed to methods of making an electronic device. A method according to one such embodiment includes attaching a first substrate to a second substrate to define a reservoir between opposing first surfaces of the first and second substrates. The reservoir is to contain one or more than one chemical, and the first substrate is to form a barrier between (1) the one or more than one chemical when the one or more than one chemical is contained in the reservoir and (2) an integrated circuit when the integrated circuit is attached to a second surface of the first substrate. The method further includes forming first and second electrical conductors to introduce an electrical signal to the one or more than one chemical when the one or more than one chemical is contained in the reservoir.

BRIEF DESCRIPTION OF THE FIGURES

FIGS. 2A through 2G illustrate embodiments of a cross section of a destructor interposer in various stages of fabrication;

FIG. 2H illustrates an embodiment of a cross section of a destructor electronic device employing flip chip bonding;

DESCRIPTION

Various embodiments of the present application include packages, for example, integrated circuits and multi-chip modules that include an anti-tampering feature that causes the package or a portion of the package to be damaged, deformed, and/or destroyed upon detection of tampering. In various embodiments, after tamper detection by a sensor (e.g., a passive sensor or an active sensor), an actuator such as, for example, a metal hydrate actuator, a piezoelectric actuator, a magnetostrictive actuator, a swellable polymer gel actuator, or a shape alloy memory actuator may be used to trigger or cause damage, deformation, and/or destruction of the package or a portion of the package.

Figure 1A:
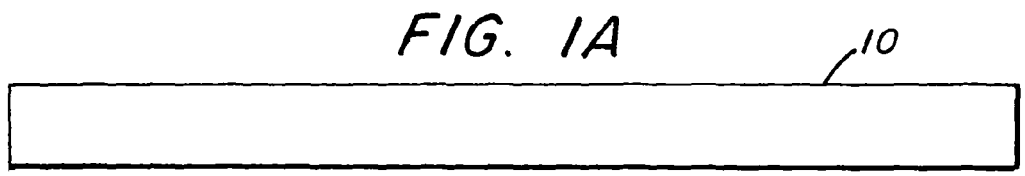
FIGS. 1A through 1J illustrate embodiments of a cross section of a destructor integrated circuit chip in various stages of fabrication.
Figure 1B:
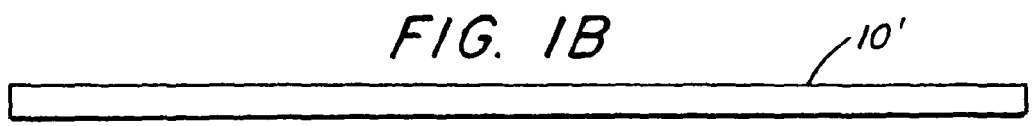
Figure 1C:
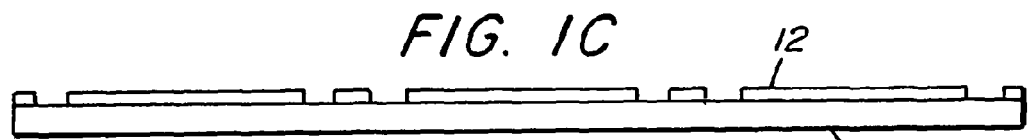
Figure 1D:
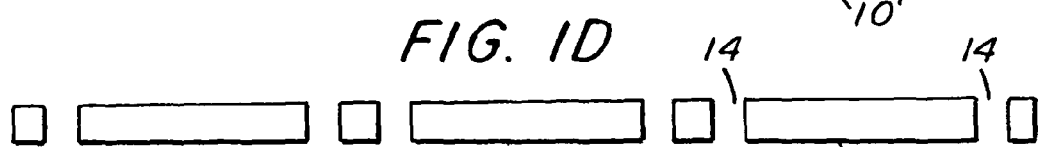

FIGS. 1A through 1J illustrate embodiments of a cross section of a destructor integrated circuit chip in various stages of fabrication. Semiconductor fabrication techniques such as, for example, photolithography, etching, ion implantation, chemical vapor deposition and physical vapor deposition may be used to define the structure of the integrated circuit chip. As shown in FIG. 1A, fabrication starts with an integrated circuit (IC) wafer 10 (e.g., a wafer constructed of Silicon) that will form the roof of the destructor integrated circuit chip. In FIG. 1B, the wafer 10 is reduced in thickness to form wafer 10' so that the wafer 10' may readily break during a destructive event. By way of example, the wafer 10 may be thinned from about 0.020 in. to 0.005 in. In FIG. 1C, a layer 12 such as a photoresist layer is formed on the wafer 10'. The photoresist may be masked, hardened, and the wafer 10' then etched to form openings 14 (FIG. 1D). The photoresist may then be stripped. The wafer 10' may be processed using semiconductor fabrication techniques (such as those set forth above) to form a number of integrated circuits 15 on the wafer 10'.

Figure 1E:
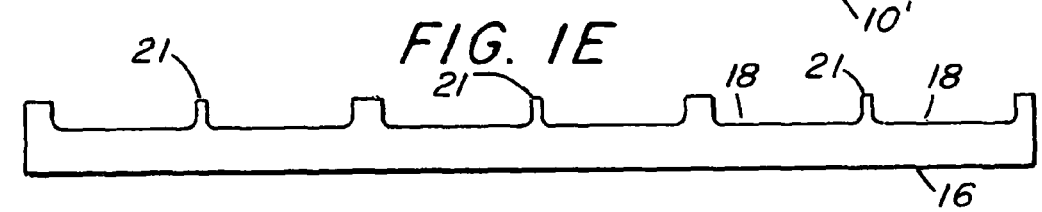
Figure 1F:
Figure 1G:
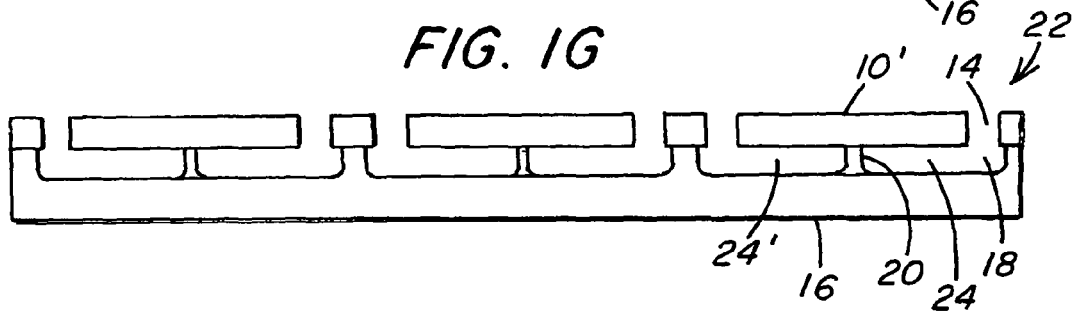

In FIG. 1E, a second blank wafer 16 undergoes a similar process as that described above for the wafer 10' to form depressions 18. In FIG. 1F, actuators 20 such as, for example, piezoelectric actuators, are formed on divided walls 21 of the depressions 18 in the depression wafer 16. It will be appreciated that in certain embodiments the divided walls 21 of the depressions 18 may be formed by virtue of forming the depressions 18. In other words, formation of the walls 21 may be a consequence of removing wafer material to form the depressions 18. In other embodiments, forming the walls 21 may cause formation of the depressions 18. For example, the walls 21 may be formed by attaching suitably dimensioned wafer material to the bases of depressions in order to subdivide the depressions into depressions 18. In such embodiments, formation of the depressions 18 may be a consequence of forming the walls 21. In FIG. 1G, the thinned IC wafer 10' is bonded to the depression wafer 16 using, for example, anodic wafer bonding to form IC wafer 22. The depressions 18 and the openings 14 form reservoirs 24 and 24' over which the integrated circuits 15 are positioned.

Figure 1H:
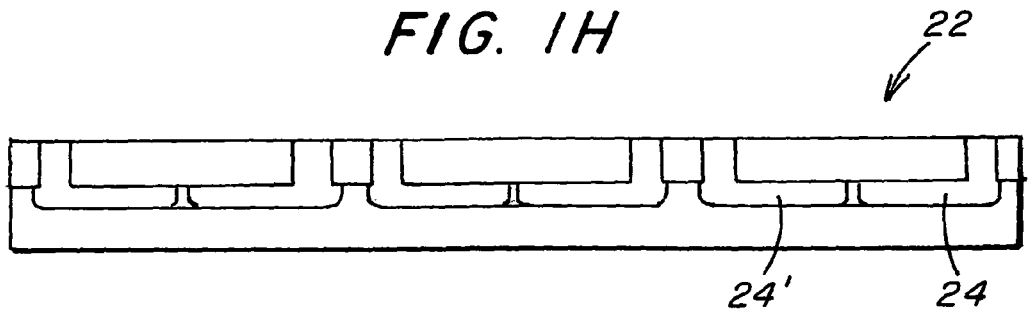

In FIG. 1H, the reservoirs 24 and 24' are filled with one or more chemicals. In various embodiments, the reservoirs 24 and 24' are each filled with the same type of chemical or chemicals. In various embodiments, the reservoirs 24 and 24' are each filled with different types of chemicals. The chemicals may be, for example, the following either alone or in combination: C4, RDX, HMX, Semtex, pentaerythritoltetranitrate, TNT, Picric acid, tri-nitrobenzene, tri-nitrophenol, nitroglycerine, nitrocellulose, nitroguanadine, a nitromethane/ammonium nitrate mixture, an ammonia/hydrogen peroxide mixture, any suitable type of nitrated compound, lead azide, silver azide, mercury fulminate, any suitable type of shock sensitive azo or peroxy compound, etc.

Figure 1I:
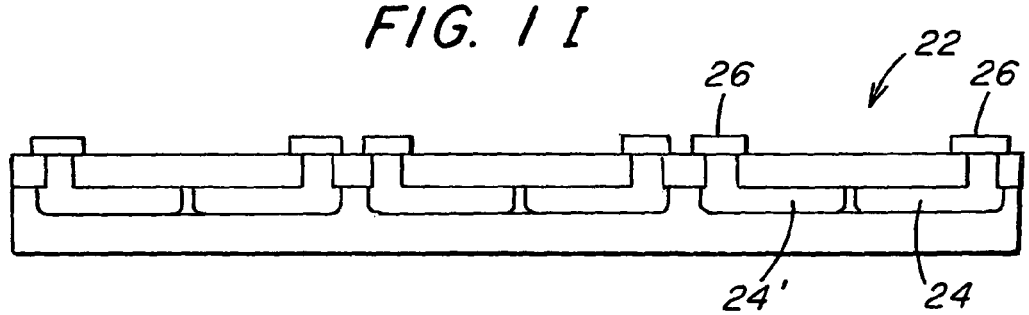
Figure 1J:
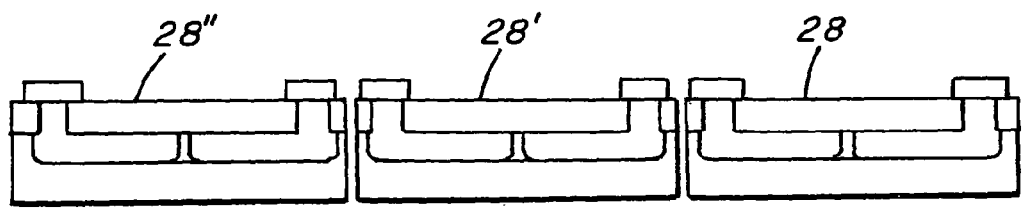

In FIG. 1I, caps 26 have been secured to the package 22 to seal the reservoirs 24 and 24'. The caps 26 may be secured by, for example, epoxy. In FIG. 1J, the IC wafer, is singulated into individual chips 28, 28' and 28" using, for example, a wafer saw.

In operation and according to various embodiments, when tampering or a similar event is detected, a signal is sent to the actuator 20, which is breached in response to the signal. A breach of the actuator 20 causes chemical or chemicals in the reservoirs 24 and 24' to mix and detonate, thus destroying and/or deforming at least a portion of the chip 28.

Figure 2A:
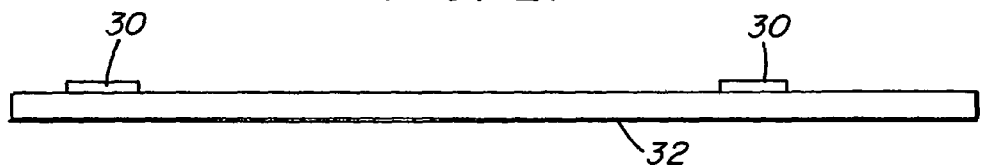
Figure 2B:
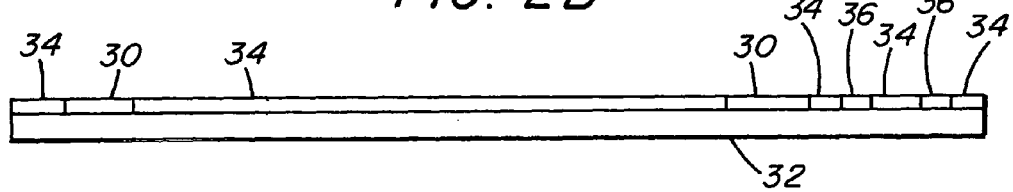
Figure 2C:
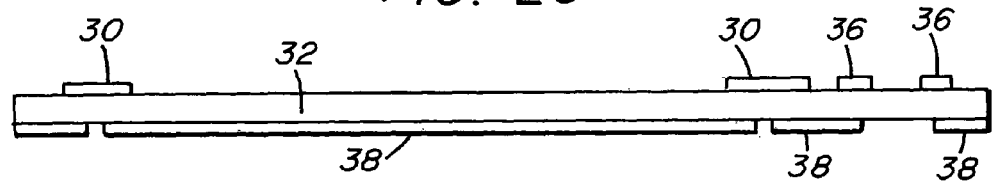
Figure 2D:
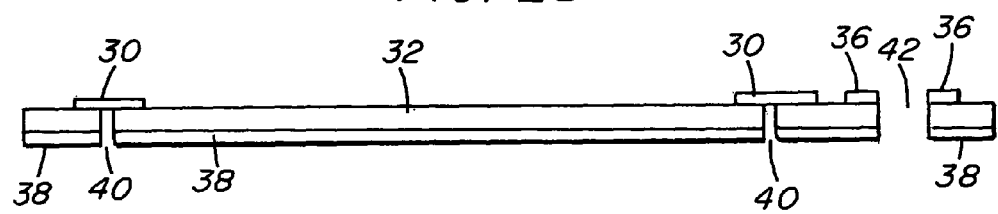
Figure 2E:
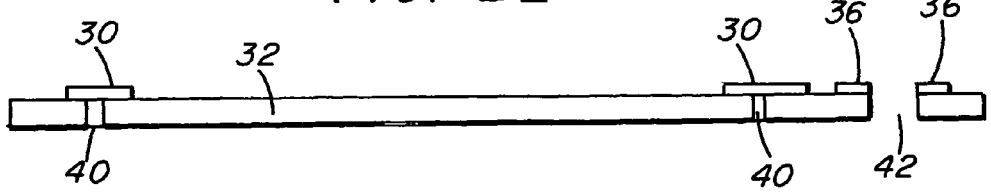

FIGS. 2A through 2G illustrate embodiments of a cross section of a destructor interposer in various stages of fabrication. In FIG. 2A, bonding pads 30 are formed on a substrate 32 (e.g., a Silicon substrate) by using, for example, standard wafer fabrication metallization processes. In FIG. 2B, photoresist 34 is deposited on the wafer 32 to pattern the footprint of the IC that is to be formed on the substrate 32, including window frames 36. In certain embodiments, the IC may be a semiconductor die, for example. In other embodiments, the IC may comprise a semiconductor die contained in a carrier, such as a chip scale package (CSP), for example. In FIG. 2C, after masking, hardening, and etching, a second photoresist layer 38 is deposited on the underside of the substrate 32 to define vias and an opening. As shown in FIG. 2D, after masking, hardening, and etching, vias 40 and opening 42 are created. In FIG. 2E, the photoresist layer 38 is stripped and the vias 40 are filled with a conductive material.

In FIG. 2F, a second substrate 44 is fabricated in a similar manner as that described in connection with the substrate 32 of FIGS. 2A through 2E such that a depression 46 is formed. In FIG. 2G, the substrate 32 is bonded to the substrate 44 to create an interposer 49 by, for example, anodic bonding such that the opening 42 and the depression 46 form a reservoir 48.

In FIG. 2H, the destructor electronic device 50 is formed by bonding an integrated circuit (IC) chip 52 onto the interposer 49 at the bonding pads 30. The reservoir 46 is filled with a chemical or chemicals, such as an explosive chemical, and a cap 54 is attached to the interposer 49 by, for example, epoxy bonding.

In operation, if tampering is detected by some sensor in the package 50, an actuator (not shown) can send an electrical signal through the vias 40 such that the chemical or chemicals in the reservoir 46 detonate or ignite by, for example, a chemical reaction caused by the current of the electrical signal passing through the chemical or chemicals.

Figure 3:
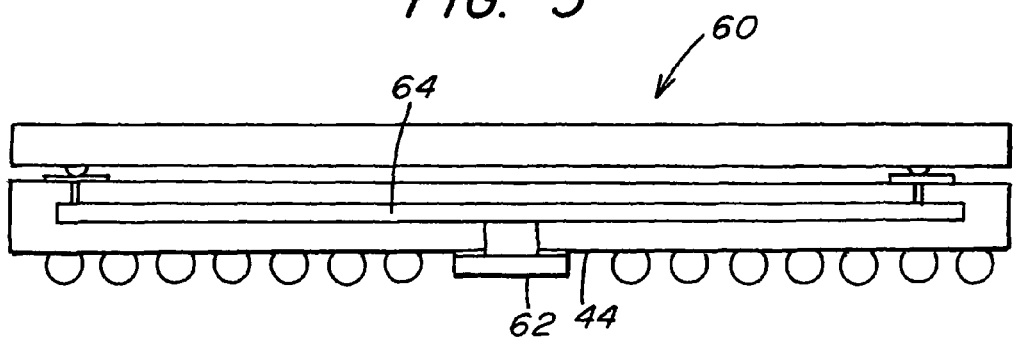
FIG. 3 illustrates another embodiment of a cross section of a destructor electronic device employing flip chip bonding.

FIG. 3 illustrates another embodiment of a cross section of a destructor electronic device 60 employing flip chip bonding. The destructor electronic device 60 is similar to the electronic device 50 of FIG. 2H except that a cap 62 is formed on the underside of the substrate 44 after a reservoir 64 is filled with a chemical or chemicals.

Figure 4:
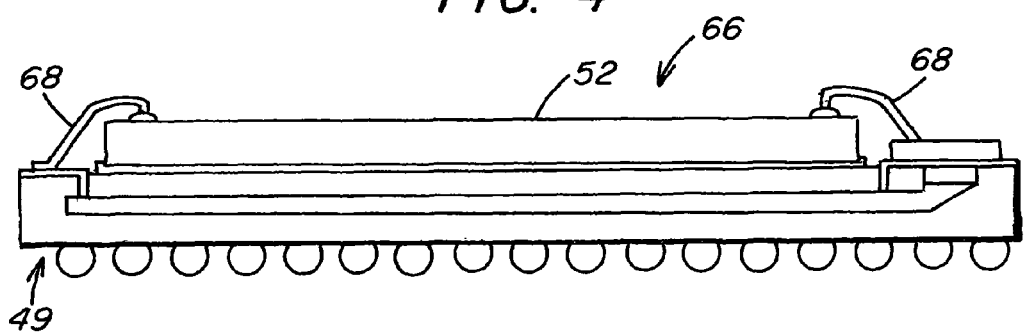
FIG. 4 illustrates an embodiment of a cross section of a destructor electronic device employing wire bonding.
Figure 5:
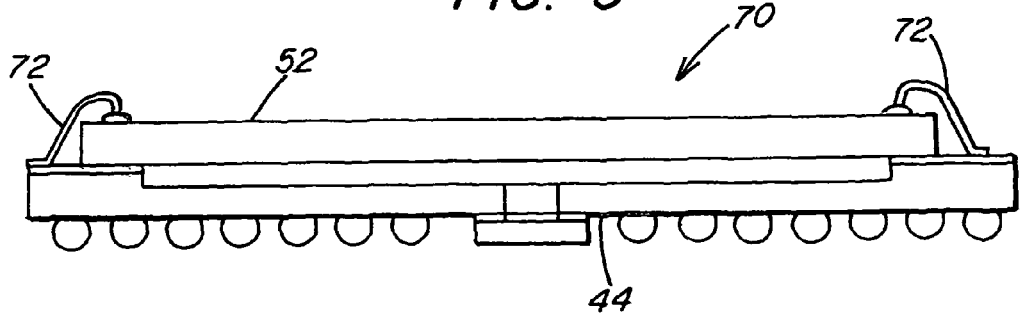
FIG. 5 illustrates another embodiment of a cross section of a destructor electronic device employing wire bonding.

FIG. 4 illustrates an embodiment of a cross section of a destructor electronic device 66 employing wire bonding. The electronic device 66 is similar to the destructor electronic device 50 of FIG. 2H except that the integrated circuit chip 52 is attached to the interposer 49 and electrically connected to the interposer through wire bonds 68. FIG. 5 illustrates an embodiment of a cross section of a destructor electronic device 70 employing wire bonding. The destructor electronic device 70 is similar to the destructor electronic device 60 of FIG. 3 except that the thinned IC chip 52 is directly anodic bonded to the depression half of the interposer 44 and electrically connected to the interposer through wire bonds 72.

It is to be understood that the figures and descriptions of embodiments of the present application have been simplified to illustrate elements that are relevant for a clear understanding of the present application, while eliminating, for purposes of clarity, other elements. Those of ordinary skill in the art will recognize, however, that these and other elements may be desirable for practice of various aspects of the present embodiments. However, because such elements are well known in the art, and because they do not facilitate a better understanding of the present application, a discussion of such elements is not provided herein.

It can be appreciated that, in some embodiments of the present methods and systems disclosed herein, a single component can be replaced by multiple components, and multiple components replaced by a single component, to perform a given function or functions. Except where such substitution would not be operative to practice the present methods and systems, such substitution is within the scope of the present application.

Examples presented herein, including operational examples, are intended to illustrate potential implementations of the present method and system embodiments. It can be appreciated that such examples are intended primarily for purposes of illustration. No particular aspect or aspects of the example method, product, computer-readable media, and/or system embodiments described herein are intended to limit the scope of the present application.

It should be appreciated that figures presented herein are intended for illustrative purposes and are not intended as construction drawings. Omitted details and modifications or alternative embodiments are within the purview of persons of ordinary skill in the art. Furthermore, whereas particular embodiments of the application have been described herein for the purpose of illustrating the application and not for the purpose of limiting the same, it will be appreciated by those of ordinary skill in the art that numerous, variations of the details, materials and arrangement of parts/elements/steps/functions may be made within the principle and scope of the application without departing from the application as described in the appended claims.

The invention claimed is:

1. A method of fabricating an electronic circuit, comprising:
   forming a first depression on a first surface of a first wafer;
   forming a second depression on the first surface of the first wafer, the second depression adjacent the first depression and separated from the first depression by a wall;
   locating an actuator on the wall; and
   attaching a first surface of a second wafer to the first surface of the first wafer to cover the first and second depressions, a first portion of the second wafer and the first depression defining a first reservoir to contain a first chemical, and a second portion of the second wafer and the second depression defining a second reservoir to contain a second chemical.

2. The method of claim 1, comprising:
   forming at least one circuit on a second surface of the second wafer.

3. The method of claim 1, comprising:
   forming multiple first and second depressions;
   locating an actuator on each wall;
   attaching a first surface of a second wafer to the first surface of the first wafer to cover the multiple first and second depressions; and
   dividing the attached first and second wafers into a plurality of portions, each portion comprising a first and second reservoir.

4. The method of claim 1, comprising:
   placing a first chemical into the first reservoir through a first opening in communication with the first reservoir;
   placing a second chemical into the second reservoir through a second opening in communication with the second reservoir; and
   closing the first and second openings.

5. The method of claim 4, wherein placing a second chemical into the second reservoir comprises placing a chemical into the second reservoir to react with the first chemical when mixed therewith.

6. The method of claim 4, wherein the first chemical and the second chemical are selected from the group consisting of: C4, RDX, HMX, Semtex, pentaerythritoltetranitrate, TNT, Picric acid, tri-nitrobenzene, tri-nitrophenol, nitroglycerine, nitrocellulose, nitroguanadine, a nitromethane/ammonium nitrate mixture, an ammonia/hydrogen peroxide mixture, a nitrated compound, lead azide, silver azide, mercury fulminate, a shock sensitive compound.

7. The method of claim 1, wherein forming the actuator on the wall comprises forming one of: a metal hydrate actuator, a piezoelectric actuator, a magnetostrictive actuator, a swellable polymer gel actuator, a shape memory alloy actuator.

8. A method, comprising:
forming an interposer structure to comprise:
  a first surface to electrically interface with a first device;
  a second surface to electrically interface with a second device; and
  a cavity positioned between the first and second surfaces to receive one or more chemicals, the interposer structure to form an electrical connection between the first device and the second device;
forming the cavity on a first surface of a first substrate, the first substrate comprising a second surface opposite the first surface; and
attaching a first surface of a second substrate to the first surface of the first substrate to cover the cavity, the second substrate comprising a second surface opposite the first surface;
wherein the first surface of the interposer structure comprises the second surface of the second substrate, and the second surface of the interposer structure comprises the second surface of the first substrate.

9. The method of claim 8, wherein the first device comprises an integrated circuit.

10. The method of claim 8, wherein the second device comprises one of:
an interposer for electrical interconnection; and
a multi-chip module (MCM).

11. The method of claim 8, comprising:
forming multiple bonding pads on the second surface of the second substrate; and
forming multiple conductive vias in the second substrate.

12. The method of claim 11, comprising:
forming a first conductive via electrically connected to the cavity; and
forming a second conductive via electrically connected to the cavity.

13. The method of claim 12, comprising:
forming the first conductive via electrically connected to a first bonding pad; and
forming the second conductive via electrically connected to a first bonding pad.

14. The method of claim 11, comprising:
bonding the first device to the bonding pads using flip chip bonding.

15. The method of claim 11, comprising:
bonding the first device to the bonding pads using wire bonding.

16. A method, comprising:
forming an interposer structure to comprise:
  a first surface to electrically interface with a first device;
  a second surface to electrically interface with a second device; and
  a cavity positioned between the first and second surfaces to receive one or more chemicals, the interposer structure to form an electrical connection between the first device and the second device;
forming the cavity on a first surface of a first substrate, the first substrate comprising a second surface opposite the first surface; and
forming an opening to connect the cavity to an exterior of the interposer structure;
placing the one or more chemicals into the cavity through the opening; and
sealing the opening to contain the chemical in the cavity.

17. The method of claim 16, comprising:
placing one or more of the following chemicals into the cavity through the opening: C4, RDX, HMX, Semtex, pentaerythritoltetranitrate, TNT, Picric acid, tri-nitrobenzene, tri-nitrophenol, nitroglycerine, nitrocellulose, nitroguanadine, a nitromethane/ammonium nitrate mixture, an ammonia/hydrogen peroxide mixture, a nitrated compound, lead azide, silver azide, mercury fulminate, a shock sensitive compound.

18. A method, comprising:
forming an interposer structure to comprise:
  a first surface to electrically interface with a first device;
  a second surface to electrically interface with a second device; and
  a cavity positioned between the first and second surfaces to receive one or more chemicals, the interposer structure to form an electrical connection between the first device and the second device;
forming the cavity on a first surface of a first substrate, the first substrate comprising a second surface opposite the first surface;
forming multiple bonding pads on the first surface of the first substrate;
attaching the first device to the first surface of the first substrate to cover the cavity; and
electrically connecting the first device to the bonding pads using wire bonds.

19. The method of claim 18, comprising:
forming a first bonding pad to electrically connect with the cavity; and
forming a second bonding pad to electrically connect with the cavity.

* * * * *